United States Patent
Ebner et al.

(10) Patent No.: US 12,320,035 B2
(45) Date of Patent: Jun. 3, 2025

(54) CRYSTAL GROWTH APPARATUS WITH MOVABLE SEED FIXTURE

(71) Applicant: EBNER Industrieofenbau GmbH, Leonding (AT)

(72) Inventors: Robert Ebner, Leonding (AT); Chih-Yung Hsiung, Leonding (AT); Ghassan Barbar, Neunkirchen (DE); Kanaparin Ariyawong, Leonding (AT); Bernd Gruhn, Leonding (AT); Tong Li, Leonding (AT)

(73) Assignee: EBNER Industrieofenbau GmbH, Leonding (AT)

( * ) Notice: Subject to any disclaimer, the term of this patent is extended or adjusted under 35 U.S.C. 154(b) by 107 days.

(21) Appl. No.: 17/910,178

(22) PCT Filed: Mar. 8, 2021

(86) PCT No.: PCT/AT2021/060082
§ 371 (c)(1),
(2) Date: Sep. 8, 2022

(87) PCT Pub. No.: WO2021/179027
PCT Pub. Date: Sep. 16, 2021

(65) Prior Publication Data
US 2023/0100383 A1    Mar. 30, 2023

(30) Foreign Application Priority Data

Mar. 9, 2020   (DE) ..................... 10 2020 106 291.5

(51) Int. Cl.
C30B 35/00    (2006.01)
C30B 29/20    (2006.01)

(52) U.S. Cl.
CPC ............ C30B 35/002 (2013.01); C30B 29/20 (2013.01)

(58) Field of Classification Search
CPC ........ C30B 29/20; C30B 35/00; C30B 35/002
See application file for complete search history.

(56) References Cited

U.S. PATENT DOCUMENTS 3,552,931 A    1/1971  Doherty et al.
5,234,664 A *  8/1993  Drechsel ................ C30B 15/30
                                                  422/252

(Continued)

FOREIGN PATENT DOCUMENTS

CN    103243378 A    8/2013
CN    108026663 A    5/2018

(Continued)

OTHER PUBLICATIONS

International Search Report in PCT/AT2021/060082, mailed Jun. 25, 2021.

*Primary Examiner* — Hua Qi
(74) *Attorney, Agent, or Firm* — Collard & Roe, P.C.

(57) ABSTRACT

A crucible device for growing crystals includes a container being arrangeable in a heating chamber of a heating apparatus, and a seed fixture element. The container includes a base section and the seed fixture element includes a seed surface which is configured for attaching a seed crystal. The seed fixture element is moveable coupled to the base section such that the distance between the seed surface and the base section is adjustable.

7 Claims, 2 Drawing Sheets

(56) References Cited

U.S. PATENT DOCUMENTS

| | | | |
|---|---|---|---|
| 5,900,059 A * | 5/1999 | Shimanuki | C30B 15/14 |
| | | | 117/217 |
| 8,936,680 B2 | 1/2015 | Katsuno et al. | |
| 10,094,040 B2 | 8/2018 | Jones et al. | |
| 2006/0185580 A1 * | 8/2006 | Tohta | C30B 15/08 |
| | | | 117/902 |
| 2014/0182512 A1 | 7/2014 | Chang | |
| 2020/0032414 A1 | 1/2020 | Muto | |
| 2020/0325595 A1 | 10/2020 | Eto et al. | |

FOREIGN PATENT DOCUMENTS

| | | | |
|---|---|---|---|
| CN | 207313744 U | * | 5/2018 |
| CN | 110777427 A | | 2/2020 |
| DE | 2012454 A | | 2/1972 |
| EP | 2 405 038 A1 | | 1/2012 |
| GB | 1285853 A | | 8/1972 |
| TW | 201435162 A | | 9/2014 |
| WO | 2015/067552 A1 | | 5/2015 |

\* cited by examiner

CRYSTAL GROWTH APPARATUS WITH MOVABLE SEED FIXTURE

CROSS REFERENCE TO RELATED APPLICATIONS

This application is the National Stage of PCT/AT2021/060082 filed on Mar. 8, 2021, which claims priority under 35 U.S.C. § 119 of German Application No. 10 2020 106 291.5 filed on Mar. 9, 2020, the disclosure of which is incorporated by reference. The international application under PCT article 21(2) was published in English.

FIELD OF INVENTION

The present invention relates to a crucible device for growing crystals and to a method for growing crystals.

ART BACKGROUND

A single crystal or monocrystalline solid is a material in which a crystal lattice of the entire sample is continuous and unbroken to the edges of the sample without grain boundaries. The absence of the defects associated with grain boundaries can give monocrystals unique properties, particularly mechanical, optical and electrical, which can also be anisotropic, depending on the type of crystallographic structure. These properties, in addition to making them precious in some gems, are industrially used in technological applications, especially in optics and electronics.

Crystal growth is the process where a pre-existing crystal becomes larger as more atoms or molecules or ions add in their positions in the crystal lattice. A crystal is defined as being atoms, molecules, or ions arranged in an orderly repeating pattern, a crystal lattice, extending in all three spatial dimensions. So crystal growth differs from growth of a liquid droplet in that during growth the molecules or ions must fall into the correct lattice positions in order, for a well-ordered crystal to grow.

Crystallization of a biological macromolecule such as protein is basically adapted to perform a treatment of eliminating a solvent from an aqueous or anhydrous solution containing the macromolecule thereby attaining a supersaturated state and growing a crystal, similarly to the case of a general low molecular weight compound such as inorganic salt. Typical methods therefor are e.g. a batch method, a dialysis method and a gas-liquid correlation diffusion method, which are chosen depending on the type, the quantity, the properties etc. of a sample.

For example, crystal growth may be used to obtain single crystals of compounds and semiconductors (e.g. Carbides, Oxides, Fluorides, Nitrides silicon, germanium and gallium arsenide), metals (e.g. palladium, platinum, silver, gold), salts and synthetic gemstones.

A further application may be the growth of large cylindrical ingots, or boules, of single crystal silicon used in the electronics industry to make semiconductor devices like integrated circuits chips, transistors, high power devices and so on.

For growing crystals, a crucible is placed inside a furnace chamber as disclosed for example in WO 2015/067552 A1. In order to form a crystal component, a seed crystal is arranged inside the crucible. The seed crystal is generally made of a desired crystal material which is the material of the crystal component to be formed. The furnace is heated up such that a crystal material inside the crucible is provided in a molten and liquid state. The crystal component is formed by growing the crystal component starting from the seed crystal at the bottom of the crucible.

However, it is difficult to provide a (continuously) constant and continuous crystal growth.

SUMMARY OF THE INVENTION

Hence, it is an object of the present invention to provide a crucible device for growing crystals providing a constant crystal growth.

According to a first aspect of the present invention a crucible device for growing crystals is presented. The crucible device comprises a container being arrangeable a heating chamber of a heating apparatus, and a seed fixture element. The container comprises a base section, wherein the seed fixture element comprises a seed surface which is configured for attaching a seed crystal. The seed fixture element is moveable coupled to the base section such that the distance between the seed surface and the base section is adjustable.

According to a further aspect of the present invention, a heating apparatus for growing crystals is presented. The heating apparatus comprises a heating chamber and the above described crucible device.

According to a further aspect of the present invention, a method for growing crystals by the above described crucible device is presented. The method comprises adjusting the distance between the seed surface and the base section by moving the seed fixture element relative to the base section.

The apparatus may be a furnace comprising the heating chamber which provides a heatable accommodation space for the crucible device. The apparatus and the crucible, respectively, heat the inner volume of the container of the crucible device until a desired temperature is reached. The temperature which may be provided inside the inner volume may be 100° C. to 1400° C., preferably to approximately 2100° C. or more. The heating chamber may comprise an insulating material, such that the inner volume of the crucible is thermally isolated from an environment, i.e. an intermediate volume, surrounding the housing.

The container comprises an inner volume in which the crystal growing takes place. The container may be made of a material selected from one of the groups (compositions) comprising metal based, oxide based, nitride based, carbon based and dense graphite. Inside the container, a seed element may be placed onto the seed surface of the seed fixture element. The seed element is made of a desired single crystal material, such as sapphire. Furthermore, a reaction fluid, such as a desired crystal material, e.g. high purity alumina crackle, is put into the inner volume of the crucible. The reaction fluid may be injected by nozzles in the direction to the crystal. If the temperature inside the crucible increases, the desired material within a reaction fluid growth onto a surface of the seed crystal. Furthermore, a source of crystal material may be injected, for example via openings, such as nozzles, in the crucible, wherein the source material is selected from one of the groups (compositions) consisting of solid phase material, liquid phase, gaseous phase material and/or a mixture of the above phases. The reaction fluid may comprise methyl silicochloroform (MTS) and e.g. precursors, such as —C5H5 or CxHy. Furthermore, metal materials, ceramic materials or components thereof may be used as source material.

The container may comprise a cylindrical shape having a circular, elliptical or rectangular base surface.

The seed fixture element provides a seed surface onto which the seed crystal may be fixed, for example by clamping means and/or by gluing with adhesive materials.

The base section is arrangeable onto a bottom element of the container. The base section comprises an accommodation space and a receiving hole for the seed fixture element. For example, the base section comprises a ring structure, wherein the seed fixation element is moveable inside the inner ring structure.

The seed fixture element is movable with respect to the base section in order to adjust the distance between the seed surface (and the growth surface), respectively, of the seed fixture element and the base section along an extending direction. The extending direction defines the moving direction of the seed fixture element with respect to the base section.

Inside the inner volume of the container, it is an aim to provide a desired exact temperature gradient for controlling the growth of the crystal at a growth surface. However, it is difficult to provide for example higher temperatures in the bottom region than in other regions of the inner volume of the crucible due to convection. Hence, by the movable seed fixture element it is possible to provide a constant position of the growth edges of the seed crystal and the already grown crystal, respectively, inside the inner volume of the container. For example, if the crystal growths, the seed fixture element is moved with respect to the base section such that the growth edges of the growing crystal, on which new crystal material growths, is kept at the same location within the container and a constant distance between the growth edges of the growing crystal and the bottom element of the container can be provided. Hence, if the location of the edges of the crystal (i.e. at the growth surface) at which new material growth is known and base section and the bottom element, respectively, is kept constant, it is easier to provide constant growth parameters, such as constant temperature and constant material support of the reaction fluid at the given location of the growth edges. Hence, a more constant crystal growth is possible.

However, it is also possible to provide different heating zones within the container along the extending direction. Hence, the seed fixture element may be adjusted inside the container, such that the seed surface and the growing surface is arranged in a desired heating zone inside the container.

According to a further exemplary embodiment, the base section comprises a receiving hole in which the seed fixture element is moveable in and out for adjusting the distance between the seed surface and the base section. As described above, the base section may comprise a ring structure and a hollow cylinder structure, respectively, in which the seed fixture element (such as a solid cylindrical structure) is movable. Between the outer surface of the seed fixture element and the inner surface of the base section, guiding structures, such as guiding rails or the below described thread, may be provided. Hence, the base structure supports the seed fixture element in a movable manner.

According to a further exemplary embodiment, the base section and the seed fixture element are coupled by a screw connection such that upon rotating one of the base sections and the seed fixture element the distance between the seed surface and the base section is adjustable (and the seed fixture element is moveable in and out of the receiving hole of the base element, respectively). For example, the seed fixture element may comprise an outer male thread and the base element may comprise in the receiving hole an inner female thread being complementary and coupleable to the male thread. Hence, upon rotation, the seed fixture element can be screwed inside and outside of the receiving hole.

According to a further exemplary embodiment, the crucible device further comprises a rotating actuator coupled to at least one of the base sections and the seed fixture element for rotating base section and the seed fixture element. The rotating actuator may comprise for example a servo motor.

According to a further exemplary embodiment, the crucible device may comprise an extractable lifting plunger for lifting the seed fixture element with respect to the base section. Hence, the seed fixture element may be lifted and lowered without a rotation during the lifting and lowering. Between the base section and the seed fixture element, supporting structures, such as guiding rail couplings may be provided.

According to a further exemplary embodiment, the crucible device further comprises at least one spacer element being arranged between the base section and the seed fixture element. The spacer element may be movably coupled to the base section and the seed fixture element may be movably coupled to the spacer element. The spacer element may comprise for example a further receiving hole in which the seed fixture element is movably arrangeable. Additionally, the spacer element may be movable inside the receiving hole of the base section. Hence, upon adjusting the distance between the seed surface and the base section, the seed fixture element is movable relatively to the spacer element and the spacer element is movable relatively to the base section.

In a further exemplary embodiment, a further spacer element may be provided for example between the spacer element and the seed fixture element. Accordingly, the further receiving hole is arranged within the further spacer element, such that the seed fixture element is movably inside the further receiving hole of the further spacer element. Furthermore, the further spacer element is movably inside the receiving hole of the spacer element. In this manner, a plurality of spacer element may be provided, so that a large distance between the base section and the seed surface can be bridged by the spacer elements.

Hence, according to further exemplary embodiment, wherein at least the spacer element(s) and the seed fixture element are extractable in a telescopically manner. As described above, a spacer element may be provided for example between the base section and the seed fixture element. Accordingly, a further receiving hole is arranged within a spacer element, such that the seed fixture element is movably inside the receiving hole of the spacer element. Furthermore, a further spacer element is movably inside a receiving hole of a further spacer element. In this manner, a plurality of spacer elements may be provided, so that the seed fixture element is extractable together with the spacer element in a telescopically manner.

According to further exemplary embodiment, the spacer element is coupled to at least one of the base sections and the seed fixture element by a screw connection such that upon rotating the spacer element the distance between the seed surface and the base section is adjustable. for example, in the further receiving hole of the spacer element, and in the thread is provided which is coupled to a corresponding thread of the outer surface of the seed fixture element. Hence, the seed fixture element can be screwed inside the further receiving hole of the spacer element. Hence, if the seed fixture element achieves a screw and position inside the further receiving hole of the spacer element, upon further rotation of the seed fixture element, the spacer element rotates together with the seed fixture element. The spacer element may comprise at its outer surface a thread which corresponds to an inner thread at the receiving hole of the base section. Hence, upon rotation of the spacer element, the spacer element together with the seed fixture element can be screwed inside the receiving hole. Hence, a screw coupling between all components, i.e. the base section, the spacer element(s) and the seed fixture element, can be provided.

According to further exemplary embodiment, the base section forms a bottom section or a top section, in particular a lid, of the container. Hence, while the base section may be arranged at the bottom of the container, the base section may also arrange overhead at a top section, such as a lid, of the container. Hence, the seed fixture element may be moved from the top of the container inside and to the center of the container. The extending direction of the seed fixture element with respect to the base section may be vertical. However, the base section may also be arranged at a wall or side surface of the container, such that the extending direction may be horizontal.

In a further exemplary embodiment, the base section and the seed fixture element may be arranged in such a manner, that the extending direction may be between 1° and 89° with respect to the vertical direction. in a further exemplary embodiment, a tilting mechanism is provided in order to the base section with respect to a bottom surface or top surface of the container. Hence, an angle of the extending direction with respect to the vertical direction may be adjustable.

According to further exemplary embodiment, the crucible device further comprises a control unit configured for controlling the distance between the seed surface and the base section. For example, position sensors are arranged within the crucible, wherein the position sensors detect the position of the growing surface of the crystal inside the container. Hence, upon receiving the position data of the position sensor, the control device may control the distance between the seed surface of the seed fixture element and the base section, such that the position of the growing surface inside the container may be kept constant. For example, the control unit is coupled to the actuator for moving the seed fixture element and/or the spacer elements in a translatory movement or a rotary movement. Additionally, temperature sensors may be provided for measuring the temperature inside the container, in particular at the position of the growing surface of the crystal inside the container. Hence, the control unit may be configured for controlling the temperature inside the container for keeping the temperature at the growing surface of the crystal inside the container constant.

For example, the heating chamber comprises a plurality of heating elements, which surround in particular an outer wall of the container to provide a heat energy. The heating elements may also be arranged in the accommodation space between an outer wall of the chamber and the sidewall of the container. The heating elements may be for example tubes which surround the chamber and the crucible, respectively, wherein the tube comprises a heating medium, such as a hot liquid or hot gas. For example, the heating elements may surround the sidewalls, the top and the bottom of the crucible.

The heating elements may provide a desired temperature profile within the container. The temperature profile may comprise a plurality of different heating zones having different temperatures with respect to each other. Furthermore, a constant temperature profile, having a constant temperature inside the container, may be adjusted by the heating elements.

The plurality of heating elements is configured for heating up the inner volume to a temperature between 1350° C. and 1450° C. The plurality of heating elements is selected from one of RF (radio frequency) heaters, resistive heaters and heating generators.

It has to be noted that embodiments of the invention have been described with reference to different subject matters. In particular, some embodiments have been described with reference to apparatus type claims whereas other embodiments have been described with reference to method type claims. However, a person skilled in the art will gather from the above and the following description that, unless other notified, in addition to any combination of features belonging to one type of subject matter also any combination between features relating to different subject matters, in particular between features of the apparatus type claims and features of the method type claims is considered as to be disclosed with this application.

BRIEF DESCRIPTION OF THE DRAWING

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

DETAILED DESCRIPTION OF EXEMPLARY EMBODIMENTS

Figure 1:
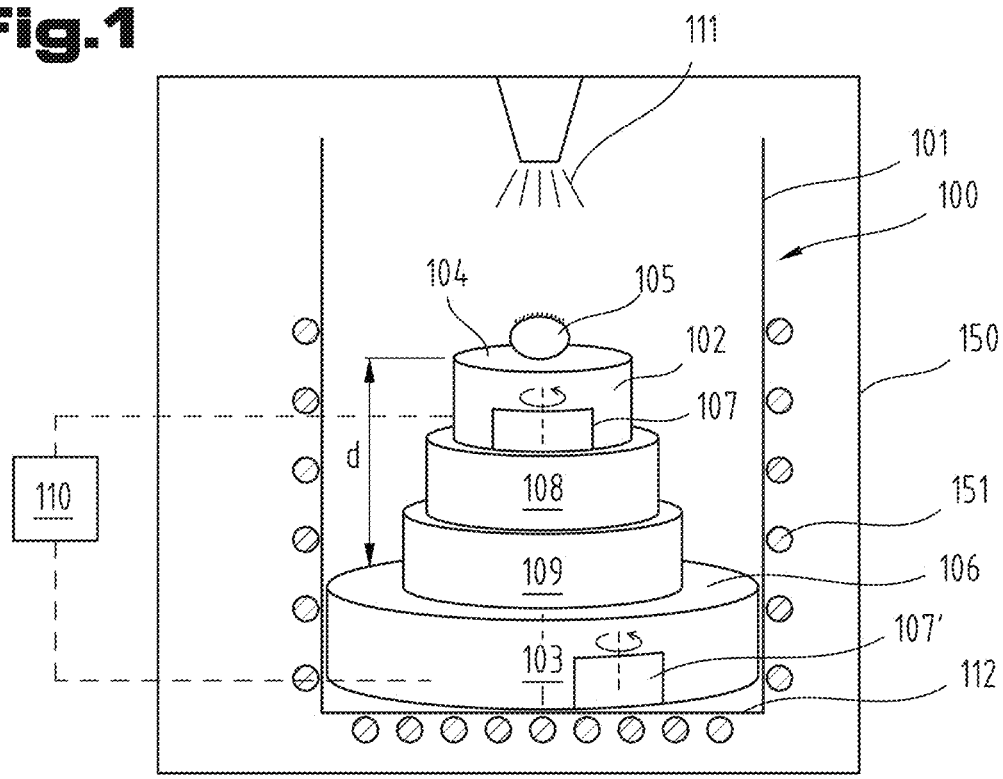
FIG. 1 shows a schematic view of the heating apparatus comprising the crucible device in an extracted state according to an exemplary embodiment of the present invention.

The illustrations in the drawings are schematic. It is noted that in different figures similar or identical elements are provided with the same reference signs.

Figure 2:
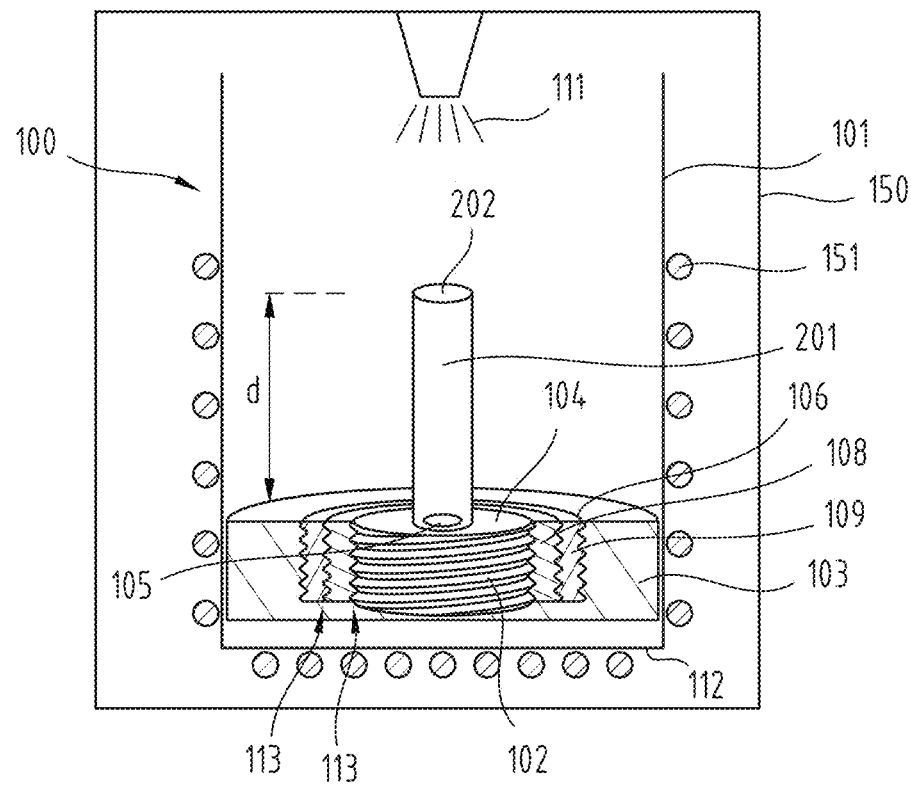
FIG. 2 shows a schematic view of the heating apparatus according to FIG. 1 in a retracted state according to an exemplary embodiment of the present invention.

FIG. 1 and FIG. 2 show schematic views of the heating apparatus comprising a crucible device 100 for growing crystals in an extracted state (FIG. 1) and a retracted state (FIG. 2) according to an exemplary embodiment of the present invention.

The crucible device 100 comprises a container 101 being arrangeable a heating chamber 150 of a heating apparatus and a seed fixture element 102. The container 101 comprises a base section 103 and the seed fixture element 102 comprises a seed surface 104 which is configured for attaching a seed crystal 105. The seed fixture element 102 is moveable coupled to the base section 103 such that the distance d between the seed surface 104 and the base section 103 is adjustable.

The apparatus is a furnace comprising the heating chamber 150 which provides a heatable accommodation space for the crucible device 100. The apparatus 150 and the crucible 100, respectively, heat the inner volume of the container of the crucible device 100 until a desired temperature is reached. The temperature which may be provided inside the inner volume may be 100° C. to 1400° C., preferably to approximately 2100° C. or more. The heating chamber 150 may comprise an insulating material, such that the inner volume of the crucible 100 is thermally isolated from an environment, i.e. an intermediate volume, surrounding the housing.

The container 101 of the crucible device 100 comprises an inner volume in which the crystal growing takes place. Inside the container 101, a seed element 105 may be placed onto the seed surface 104 of the seed fixture element 102. The seed element 105 is made of a desired single crystal material, such as sapphire. Furthermore, a reaction fluid 111, such as a desired crystal material, e.g. high purity alumina crackle, is put into the inner volume of the container 101. The reaction fluid 111 may be injected by nozzles in the direction to the crystal 105. If the temperature inside the container 101 increases, the desired material within a reaction fluid growth onto a surface of the seed crystal 105. The container 101 may comprise a cylindrical shape having a circular, elliptical or rectangular base surface.

The seed fixture element 102 provides a seed surface 104 onto which the seed crystal 105 may be fixed, for example by clamping means and/or by gluing with adhesive materials.

The base section 103 is arrangeable onto a bottom element 112 of the container 101. The base section 103 comprises an accommodation space and a receiving hole 106 for the seed fixture element 102. For example, the base section 103 comprises a ring structure, wherein the seed fixture element 102 is moveable inside the inner ring structure 103.

The seed fixture element 102 is movable with respect to the base section 103 in order to adjust the distance d between the seed surface 104 and the growth surface onto the seed crystal 105, respectively, of the seed fixture element 102 and the base section 103 along an extending direction. The extending direction defines the moving direction of the seed fixture element 102 with respect to the base section 103.

The base section 103 comprises a receiving hole 106, in which the seed fixture element 102 is moveable in and out for adjusting the distance d between the seed surface 104 and the base section 103. The base section 103 comprises a hollow cylinder structure, in which the seed fixture element 102 (such as a solid cylindrical structure) is movable. Between the outer surface of the seed fixture element 102 and the inner surface of the base section 103, guiding structures, such as guiding rails or a thread, may be provided. Hence, the base structure 103 supports the seed fixture element 102 in a movable manner.

The base section 103 and the seed fixture element 102 are coupled by a screw connection 113 such that upon rotating one of the base sections 103 and the seed fixture element 102 the distance d between the seed surface 104 and the base section 103 is adjustable. For example, the seed fixture element 102 may comprise an outer male thread and the base element may comprise in the receiving hole 106 an inner female thread being complementary and coupleable to the male thread. Hence, upon rotation, the seed fixture element 102 can be screwed inside and outside of the receiving hole 106.

The crucible device 100 further comprises a rotating actuator 107 coupled to at least one of the base sections 103 and the seed fixture element 102 for rotating the base section 103 with respect to the seed fixture element 103.

The crucible device 100 further comprises at least one spacer element 108, 109 being arranged between the base section 103 and the seed fixture element 102. The spacer element 108, 109 may be movably coupled to the base section 103 and the seed fixture element 102 may be movably coupled to the spacer element 108, 109. The spacer element 108 may comprise for example a further receiving hole in which the seed fixture element 102 is movably arrangeable. Additionally, the spacer element 109 may be movable inside the receiving hole 106 of the base section 103. As shown in FIGS. 1 and 2, a further spacer element 109 may be provided for example between the spacer element 108 and the base section 103. Accordingly, the further receiving hole is arranged within the spacer element 108, such that the seed fixture element 102 is movably inside the receiving hole of the spacer element 108. Furthermore, the spacer element 108 is movably inside the receiving hole of the further spacer element 109. In this manner, a plurality of spacer elements 108, 109 may be provided, so that a large distance d between the base section 103 and the seed surface 104 can be bridged by the spacer elements 108, 109. Hence, upon adjusting the distance d between the seed surface 104 and the base section 103, the seed fixture element 102 is movable relatively to the spacer elements 108, 109 and the spacer elements 108, 109 are movable relatively to the base section 103.

Hence, the spacer elements 108, 109 and the seed fixture element 102 are extractable in a telescopically manner. As can be taken from FIG. 1, the seed fixture element 102, the spacer element 108 and the further spacer element 109 are shown in a maximum extracted position for providing the largest possible distance between the seed surface 104 and the base section 103. As can be taken from FIG. 2, the seed fixture element 102, the spacer element 108 and the further spacer element 109 are shown in a retracted position, wherein for example the seed surface 104 and the surface of the base section 103 are arranged within a common plane. For example, the crystal 201 and specifically the upper growing surface 202 may have a common distance d to the surface of the base section 103.

The crucible device 100 further comprises a control unit 110 configured for controlling the distance d between the seed surface 104 (and the growing surface 202, respectively) and the base section 103. For example, position sensors are arranged within the crucible device 100, wherein the position sensors detect the position of the growing surface 202 of the crystal 201 inside the container 101. Hence, upon receiving the position data of the position sensor, the control device 110 controls the distance d between the seed surface 104 of the seed fixture element 102 and the base section 103, such that the position of the growing surface 202 inside the container 101 may be kept constant. For example, the control unit 110 is coupled to the actuator for moving the seed fixture element 102 and/or the spacer elements 108, 109 in a translatory movement or a rotary movement.

The heating chamber 150 comprises a plurality of heating elements 151, which surround in particular an outer wall of the container 101 to provide a heat energy. The heating elements may also be arranged in the accommodation space between an outer wall of the chamber 150 and the sidewall of the container 101.

Figure 3:
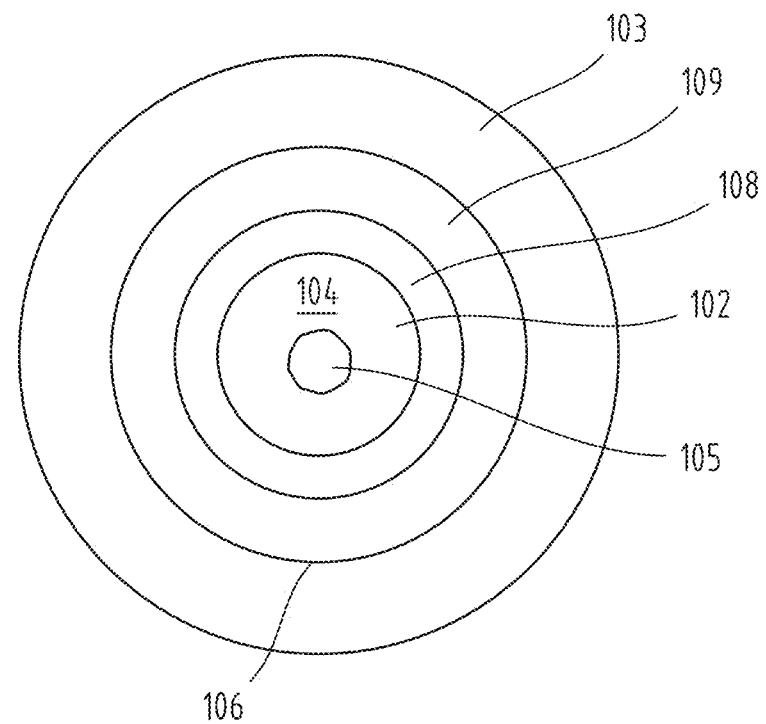
FIG. 3 shows a schematic top view of a crucible device according to an exemplary embodiment of the present invention.

FIG. 3 shows a schematic top view of a crucible device 100 according to an exemplary embodiment of the present invention. The base section 103 comprises a receiving hole 106, in which the spacer elements 108, 109 and the seed fixture element 102 is moveable in and out for adjusting the distance d between the seed surface 104 and the base section 103. The base section 103 comprises a hollow cylinder structure, in which the seed fixture element 102 (such as a solid cylindrical structure) is movable.

Figure 4:
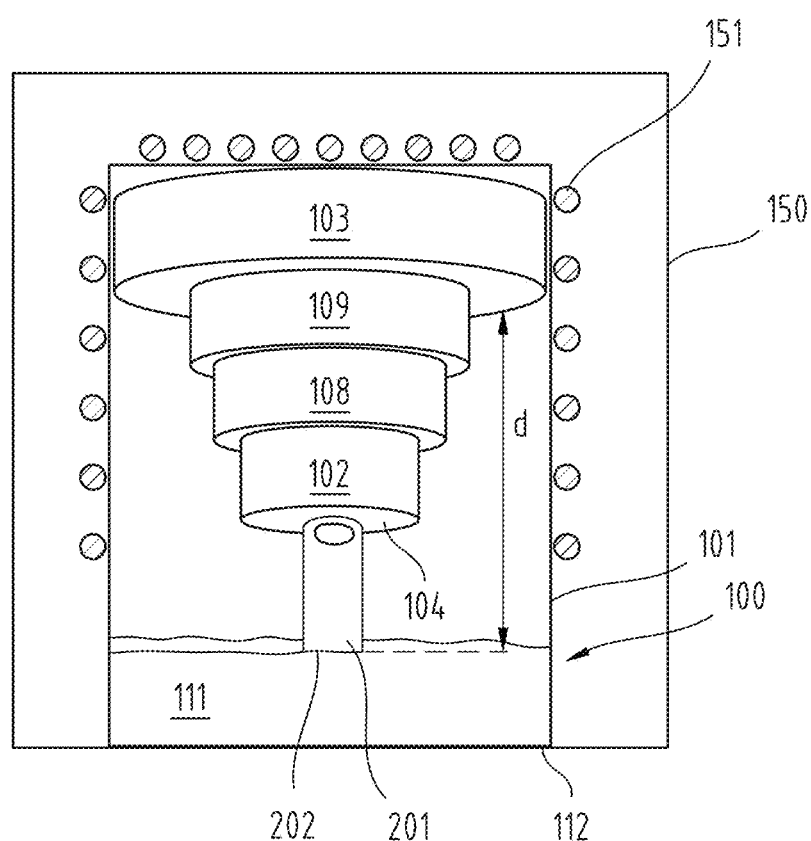
FIG. 4 shows a schematic view of a heating apparatus, wherein the base section is mounted to the top section of the container according to an exemplary embodiment of the present invention.

FIG. 4 shows a schematic view of a heating apparatus, wherein the base section 103 is mounted to the top section of the container 101 according to an exemplary embodiment of the present invention. Hence, the base section 103 is arranged overhead at a top section, such as a lid, of the container 101. Hence, the seed fixture element 102 is movable from the top of the container 101 inside and to the center of the container 101. The extending direction of the seed fixture element 102 with respect to the base section 103 may be vertical.

The reaction fluid 111 may be provided in the liquid state and may be filled inside the container 101. the growing surface 202 of the crystal 201 is dipped in the liquid reaction fluid 111. Hence, the surface of the liquid reaction fluid 111 may be kept constant for example by injecting and draining respective reaction fluid 111. Furthermore, the distance d between the base section 103 and the seed surface 104 and the growing surface 202, respectively, may be adjusted such that the growing surface 202 is dipped with a predefined depth into the reaction fluid 111. The position of the growing surface 202 with respect to the surface of the reaction fluid 111 may be monitored by respective sensors, such that for example the control unit 110 may adjust the distance d in response to the data of the respective sensors.

It should be noted that the term "comprising" does not exclude other elements or steps and "a" or "an" does not exclude a plurality. Also elements described in association with different embodiments may be combined. It should also be noted that reference signs in the claims should not be construed as limiting the scope of the claims.

LIST OF REFERENCE SIGNS 100 crucible device
101 container
102 seed fixture element
103 base section
104 seed surface
105 seed crystal
106 receiving hole
107 rotating actuator
108 spacer element
109 spacer element
110 control unit
111 reaction fluid
112 bottom element
113 screw connection
150 heating chamber
151 heating element
201 crystal
202 growing surface
d distance

The invention claimed is:

1. A heating apparatus for growing crystals, the apparatus comprising
a heating chamber, and
a crucible device for growing the crystals, the crucible device comprising
a container arranged in the heating chamber of the heating apparatus, and
a seed fixture element,
wherein the container comprises a base section,
wherein the seed fixture element comprises a seed surface which is configured for attaching a seed crystal,
wherein the seed fixture element is movably coupled to the base section such that a distance between the seed surface and the base section is adjustable,
wherein the base section comprises a receiving hole in which the seed fixture element is moveable in and out for adjusting the distance between the seed surface and the base section,
wherein at least one spacer element is arranged between the base section and the seed fixture element,
wherein the at least one spacer element comprises a further receiving hole in which the seed fixture element is movably arranged and the at least one spacer element is movable inside the receiving hole of the base section so that the at least one spacer element and the seed fixture element are extractable in a telescopic manner between a maximal extracted position and a retracted position,
wherein in the retracted position the seed surface and a surface of the base section are arranged within a common plane, and
wherein the at least one spacer element is movably coupled to the base section and the seed fixture element is movably coupled to the at least one spacer element.

2. The heating apparatus according to claim 1, wherein the base section and the seed fixture element are coupled by a screw connection such that upon rotating one of the base sections and the seed fixture element the distance between the seed surface and the base section is adjustable.

3. The heating apparatus according to claim 2, further comprising
a rotating actuator coupled to at least one of the base sections and the seed fixture element for rotating base section and the seed fixture element.

4. The heating apparatus according to claim 1, wherein the at least one spacer element is coupled to at least one of the base sections and the seed fixture element by a screw connection such that upon rotating the at least one spacer element the distance between the seed surface and the base section is adjustable.

5. The heating apparatus according to claim 1, wherein the base section forms a bottom section or a top section of the container.

6. A method for growing crystals by the heating apparatus according to claim 1, the method comprising
adjusting the distance between the seed surface and the base section by moving the seed fixture element relative to the base section, for which reason the at least one spacer element is arranged between the base section and the seed fixture element,
wherein the at least one spacer element is movably coupled to the base section and the seed fixture element is movably couples to the at least one spacer element,
wherein the at least one spacer element comprises a further receiving hole in which the seed fixture element is movably arranged and the at least one spacer element is movable inside the receiving hole of the base section so that the at least one spacer element and the seed fixture element are extractable in a telescopic manner between a maximal extracted position and a retracted position,
wherein in the retracted position the seed surface and a surface of the base section are arranged within a common plane.

7. The heating apparatus according to claim 1, wherein the base section forms a lid of the container.

* * * * *